(12) United States Patent
Elizondo et al.

(10) Patent No.: US 11,965,417 B2
(45) Date of Patent: Apr. 23, 2024

(54) MAGNETIC SENSOR ASSEMBLY HAVING A NON-FLAT SHAPE PLUG FOR CEMENT SLURRY SENSING

(71) Applicant: Halliburton Energy Services, Inc., Houston, TX (US)

(72) Inventors: Hector Jesus Elizondo, New Caney, TX (US); Jinhua Cao, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 17/869,624

(22) Filed: Jul. 20, 2022

(65) Prior Publication Data

US 2024/0026780 A1 Jan. 25, 2024

(51) Int. Cl.
*G01R 33/12* (2006.01)
*E21B 47/13* (2012.01)
(Continued)

(52) U.S. Cl.
CPC .......... *E21B 47/13* (2020.05); *G01R 33/0047* (2013.01); *G01R 33/1223* (2013.01); *E21B 33/14* (2013.01)

(58) Field of Classification Search
CPC ................ G01R 33/00; G01R 33/0035; G01R 33/0023; G01R 33/0017; G01R 31/3191;
(Continued)

(56) References Cited

U.S. PATENT DOCUMENTS 9,506,324 B2 11/2016 Kyle et al.
9,587,486 B2 3/2017 Walton et al.
(Continued)

FOREIGN PATENT DOCUMENTS

| WO | 2022050936 A1 | 3/2022 | |
|---|---|---|---|
| WO | WO-2022050936 A1 * | 3/2022 | ......... G01N 15/0806 |
| WO | 2022146492 | 7/2022 | |

OTHER PUBLICATIONS

"U.S. Appl. No. 17/009,546, Non-Final Office Action", dated Nov. 10, 2022, 33 pages.
(Continued)

*Primary Examiner* — Jermele M Hollington
*Assistant Examiner* — Taqi R Nasir
(74) *Attorney, Agent, or Firm* — DeLizio, Peacock, Lewin & Guerra, LLP

(57) ABSTRACT

Disclosed herein are embodiments of a sensor assembly apparatus, system, and method. In one embodiment, an apparatus comprises a sensor assembly adapted to be integrated into a casing to be positioned in a wellbore, the sensor assembly comprising a housing; a magnet located within the housing; a magnetic sensor located within the housing to measure a magnetic measurement change resulting from a force between the magnet and magnetic particles flowing with a cement slurry inside the casing from a reverse cementing; and a sensor plug having a side with a non-flat shape that is to be in contact with the slurry flowing in the casing of the wellbore; a processor communicatively coupled to the magnetic sensor and configured to determine whether the magnetic measurement change exceeds a magnetic threshold; and determine that the slurry is flowing back up internal to the casing at or beyond a location in the wellbore.

20 Claims, 7 Drawing Sheets

(51) Int. Cl.
*G01R 33/00* (2006.01)
*E21B 33/14* (2006.01)

(58) Field of Classification Search
CPC ............ G01R 33/0047; G01R 33/1223; G01B 7/004; G01C 17/38; G06F 3/017; G06F 3/0346; G06F 3/012; E21B 47/13; E21B 33/14

See application file for complete search history.

(56) References Cited

U.S. PATENT DOCUMENTS

| | | | |
|---|---|---|---|
| 9,920,620 | B2 | 3/2018 | Murphree et al. |
| 10,221,653 | B2 | 3/2019 | Walton et al. |
| 2002/0195247 | A1* | 12/2002 | Ciglenec ................. E21B 29/06 166/250.11 |
| 2003/0029611 | A1 | 2/2003 | Owens |
| 2003/0192695 | A1 | 10/2003 | Dillenbeck et al. |
| 2005/0284663 | A1* | 12/2005 | Hall ........................ E21B 47/13 175/48 |
| 2008/0011481 | A1 | 1/2008 | Badalamenti et al. |
| 2013/0048290 | A1 | 2/2013 | Howell et al. |
| 2013/0048291 | A1 | 2/2013 | Merron et al. |
| 2013/0264051 | A1 | 10/2013 | Kyle et al. |
| 2016/0258280 | A1 | 9/2016 | Murphree et al. |
| 2017/0204719 | A1 | 7/2017 | Babakhani |
| 2018/0030824 | A1 | 2/2018 | Roberson et al. |
| 2018/0238139 | A1 | 8/2018 | Gao et al. |
| 2019/0249549 | A1 | 8/2019 | Fripp et al. |
| 2021/0047913 | A1* | 2/2021 | Santamarina ............ G01V 3/26 |
| 2022/0065818 | A1 | 3/2022 | Werkheiser et al. |

OTHER PUBLICATIONS

"PCT Application No. PCT/US2023/065970, International Search Report and Written Opinion", dated Jul. 27, 2023, 12 pages.

PCT Application No. PCT/US2020/048989; Search Report: dated May 17, 2021, 4 pages.

PCT Application No. PCT/US2020/048989; Written Opinion; dated May 17, 2021, 6 pages.

* cited by examiner

MAGNETIC SENSOR ASSEMBLY HAVING A NON-FLAT SHAPE PLUG FOR CEMENT SLURRY SENSING

TECHNICAL FIELD

The disclosure generally relates to the field of equipment utilized and operations performed in conjunction with a subterranean well and to magnetic sensing in well tools.

BACKGROUND

Reverse circulation cementing (hereinafter "reverse cementing") involves displacing fluids between the outside of a casing and a formation wall in a subterranean well operation. A sensor on the inner or outer diameter of the casing at or near the bottom of the wellbore detects when the cementing fluids reach the bottom of the wellbore and begin entering the inside of the casing through a flow port. In response, a signal is sent downhole to close a valve to prevent cementing fluids from ascending the inside of the casing. During reverse cementing operations, the cementing fluids are aided by gravity in reaching the bottom of the wellbore.

BRIEF DESCRIPTION OF THE DRAWINGS

Embodiments of the disclosure may be better understood by referencing the accompanying drawings.

DESCRIPTION OF EMBODIMENTS

Figure 1:
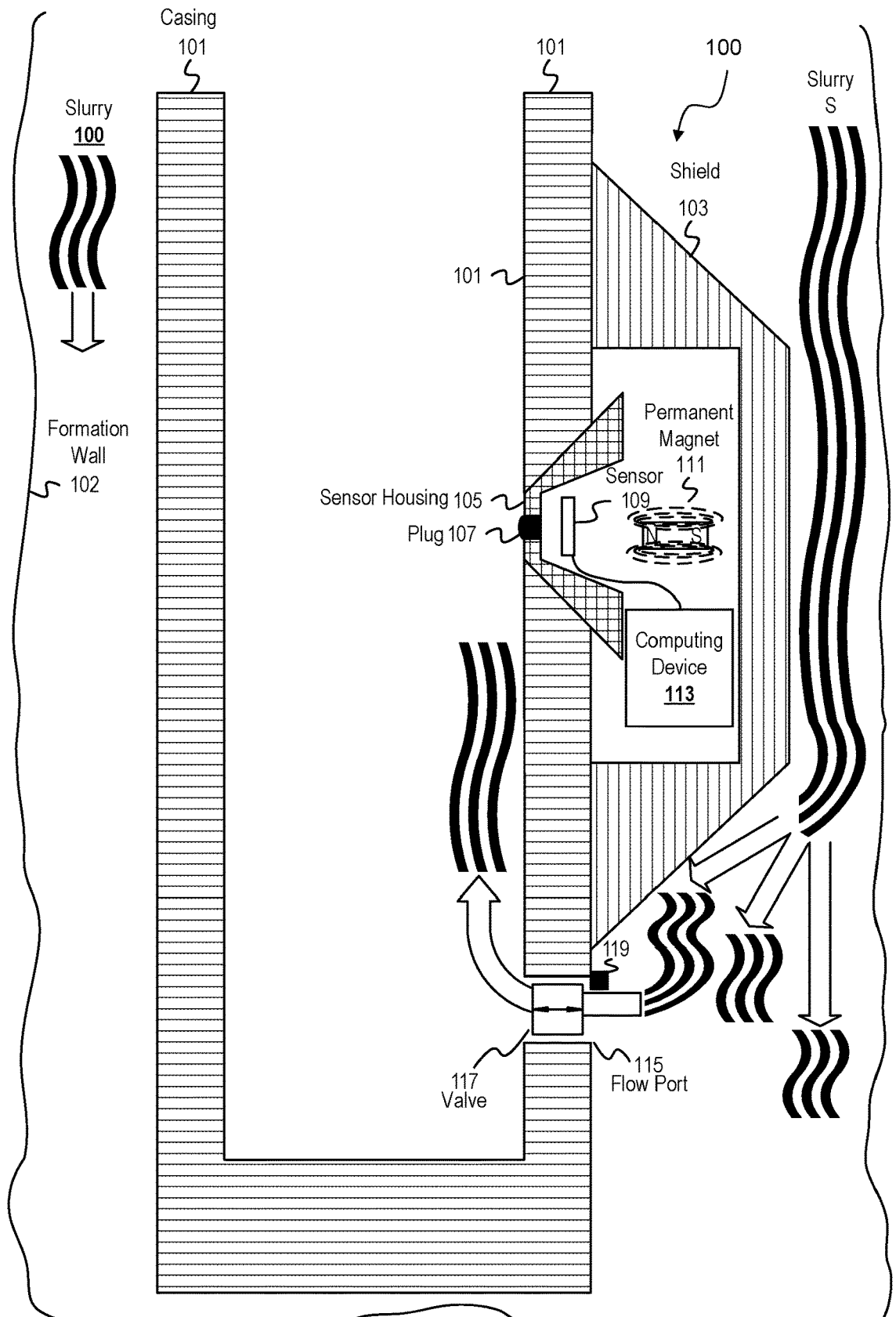
FIG. 1 depicts one example of a magnetic permeability sensing assembly with a non-flat shape plug for cement slurry sensing, according to one or more embodiments disclosed herein.

The description that follows includes example systems, methods, techniques, and program flows that embody embodiments of the disclosure. However, it is understood that this disclosure may be practiced without these specific details. For instance, this disclosure refers to measuring magnetic permeability of slurry during a reverse cementing operation in illustrative examples. Embodiments of this disclosure can be instead applied to measuring magnetic permeability of fluids or slurries during other subterranean wellbore operations including traditional cementing operations. In other instances, well-known instruction instances, protocols, structures, and techniques have not been shown in detail in order not to obfuscate the description.

Embodiments of a low-cost magnetic permeability sensing apparatus ("sensing apparatus") that can withstand hostile subterranean environments are disclosed for activating devices downhole based on magnetic permeability sensing, including activating a valve during reverse cementing operations. At designated stages of reverse cementing operations, a material with high magnetic permeability is added to a slurry to be sent downhole to enable a magnetic sensor to detect the magnetic permeability of the slurry. The sensing apparatus is situated downhole near a flow port to detect the presence of a fluid, such as slurry, with known magnetic permeability corresponding to the slurry sent downhole and to send a signal to close a valve (e.g., a sliding sleeve, ball valve, etc.) either at the flow port or across the cross section of an oilfield tubular. Once the known slurry is detected, an additional signal (e.g., a wired signal like through electric line or fiber optics, or a wireless signal such as a pressure rise, an acoustic signal, or the like) is sent by the sensing apparatus to a controller of the reverse cementing operations at the surface to stop flow of the current slurry and/or commence flow of a different slurry. In one application, the additional signal is a pressure rise associated with the increased flow resistance from the valve closing. The sensing apparatus comprises a magnet source (e.g., a permanent magnet or an electromagnet) and a magnetic sensor. The sensing apparatus is configured to detect specific ranges of magnetic permeability by inducing a magnetic field in the slurry to be read by the magnetic sensor. The magnetic sensor detects different slurries downhole based on different concentrations of the high magnetic permeability material in the slurry which results in magnetic fields with different strengths at the sensor. This sensing apparatus can be constructed from low-cost materials even for operational conditions downhole and detects multiple types of cementing fluids using accurate measurements of magnetic permeability.

In some embodiments, a non-flat shaped plug may be used with the magnetic sensor. The proposed non-flat sensor plug, in some embodiments, may have a dome shape on the side that is in contact with fluid in the borehole. The non-flat shape provides an increased distance from the magnet to the fluid (e.g., slurry) and reduce the magnetic force. The non-flat plug may also increase flow-induced force on the particles in the fluid which helps to carry the particles away.

Example System

FIG. 1 depicts an example magnetic permeability sensing apparatus 100 for fluid sensing, according to one or more embodiments disclosed herein. In some embodiments, the sensing apparatus 100 may have a non-flat shape plug 107 on one side thereof. During reverse cementing operations, a slurry S of cementing fluids flows outside an oilfield tubular 101, adjacent to a formation wall 102, and into a flow port 115 after which it is detected by the sensing apparatus 100. The sensing apparatus 100 comprises a magnet 111, a magnetic sensor 109, a computing device 113 coupled to the magnetic sensor 109, and a housing 105. The plug 107, in some embodiments, may be made of a non-ferromagnetic material. The illustrated sensing apparatus 100 may also, in some embodiments, include a shield 103 that protects the sensing apparatus 100 from the slurry S on the outside of the oilfield tubular 101. The magnetic sensor 109 is situated between the magnet 111 and the housing 105. In alternate embodiments, the magnetic sensor 109 may be placed anywhere in the magnetic flux path. The magnet 111 is mechanically connected to the shield 103 (e.g., with an adhesive, magnetic attraction, threaded, press fit, etc.), to the housing 105, or to the magnetic sensor 109 and positioned within the sensor housing 105 to induce a magnetic field outside of the sensor housing 105 into the interior of the oilfield tubular 101. The magnetic sensor 109 can be mechanically connected to the plug 107, the shield 103, the permanent magnet 111, or to the sensor housing 105 (e.g., with a fixture, adhesive, threaded connection, press fit, adhesive, etc.). The sensing apparatus is attached to or integrated into the oilfield tubular 101 and positioned so that the plug 107 creates a window to the interior of the oilfield tubular 101. The sensor housing 105 is positioned near the flow port 115 so that the presence of the slurry S is detected as the slurry S enters the interior of the oilfield tubular 101. In some cases, there is no separate plug 107 because the entire sensor housing 105 is non-ferromagnetic and serves as a magnetic window for the magnetic field. The window created by the plug 107 allows the magnetic sensor 109 to measure the magnetic permeability of the slurry S outside of the sensor housing 105, which experiences the magnetic field induced by the magnet 111 through the plug 107 as it flows past the sensing apparatus. Once a permeability change from the cementing fluid is detected, the computing device 113 sends a signal to an actuating mechanism 119 to close a valve 117 at a flow port 115 in the oilfield tubular 101. The sensing apparatus pictured in FIG. 1 is integrated into the oilfield tubular 101 prior to deployment downhole and can be powered on deployment of the oilfield tubular 101 to preserve battery power.

The plug 107 comprises any low-cost non-ferromagnetic material that allows the passage of the magnetic field (i.e., has low magnetic permeability) of the permanent magnet 111 as it passes through the plug 107 and into the slurry S. For instance, the non-ferromagnetic material can be steel, titanium, aluminum, any alloys thereof such as INCONEL® alloy 718, plastics, composites, ceramics, glass, etc. The sensor housing 105 and shield 103 comprise any low-cost material that can protect the sensing apparatus under operational conditions (e.g., carbon steel, steel alloys, et cetera). The magnetic sensor 109 can be any sensor that detects the strength of a magnetic field or magnetic flux such as a giant magnetoresistance (GMR) sensor, Hall effect sensor, a microelectromechanical magnetic field sensor, magnetic force sensor, etc. The magnetic force sensor will be described in more detail below in reference to FIGS. 3-4. The measurements taken by the magnetic sensor 109 will increase in strength as the magnetic permeability of the slurry S increases due to the increased concentration of a high magnetic permeability material in the slurry S. The slurry S comprises a detection slurry having a plurality of particles with a high magnetic permeability such as suspended iron particles, martensitic stainless-steel particles, ferritic particles, iron oxide particles, ferrofluid particles, or other particles with a high magnetic permeability in a fluid. As the magnetic permeability of the slurry S increases, the magnetic flux detected by the magnetic sensor 109 increases. In some applications, the particle size is between 1 nm and 2 mm.

In some applications, the computing device 113 can be calibrated to detect ranges or differences of magnetic permeability for a borehole fluid, such as slurry S. The accuracy of the calibration can be increased by simulating downhole conditions (temperature, pressure, flow rate, etc.) with different cementing fluids having different magnetic permeability. The computing device 113 can be programmed to detect each cementing fluid based on the magnetic strength measured by the magnetic sensor 109 during calibration. Once the computing device 113 detects a cementing fluid in the slurry S, it sends a signal to the actuating mechanism 119 at the flow port 115 to stop fluid flow. In some embodiments, the computing device 113 may include a time delay before sending the signal to the actuating mechanism 119. Detection occurs when the computing device 113 determines that the measurements taken by the magnetic sensor 109 satisfy a detection criterion. This detection criterion can be that the magnetic flux is in a predetermined range as described above or that the magnetic field changes by a predetermined amount, indicating that a fluid of a different magnetic permeability is present (the amount of magnetic field can also be pre-calibrated). In response to a signal to stop fluid flow, the actuating mechanism 119 causes the valve 117 to close over the flow port 115 or across the diameter of the inside of the oilfield tubular 101. This valve 117 can be a sliding sleeve, a flapper, a ball valve, or any valve that can stop or can variably restrict fluid flow into the inside of the oilfield tubular 101 at operational conditions downhole. The valve 117 can be actuated by opening a flow port that allows the sleeve to shift into a closed position. For example, the sliding sleeve can be hydraulically locked in the open position and the actuation of an electronic rupture disc removes the hydraulic lock and allows the sleeve to close. The actuating mechanism 119 can be open or close a flow valve and this change in restriction in the valve results in a change in the flow port (either increased or decreased flow). In another application, the valve is on the inner diameter (ID) of the tubing and prevents axial flow up the tubing. In these applications, the valve on the ID of the tubing may be a ball valve or a flapper valve. In yet another application, the valve is on the outer diameter (OD) of the tubing and prevents axial flow down the annular space between the tubing and the formation. In this application, the valve on the OD of the tubing may be a packer.

Although depicted as a magnet, the permanent magnet 111 can be any source of magnetic flux and, in some embodiments, can be an electromagnet. For embodiments where the permanent magnet 111 is an electromagnet, the magnetic sensor 109 can detect inductance on the electromagnet (i.e., the electromagnet itself is the sensor) because the inductance of the electromagnet will vary with the magnetic permeability of the slurry S. For instance, a capacitor placed in electrical series with the electromagnet will resonate at a frequency of $1/\sqrt{LC}$ hertz, where L is the inductance and C is the capacitance. Therefore, the magnetic permeability of the slurry S influences the resonant frequency of this circuit. The resonant frequency of the circuit can be measured, for example, by applying an electrical voltage pulse to the electromagnet, measuring the frequency of the induced voltage oscillations, and sending the frequency measurements to the computing device 113. The computing device can be pre-calibrated to detect ranges of resonant frequencies corresponding to different cementing fluids, or to detect changes in the resonant frequency that indicates a change of fluid downhole.

Figure 2:
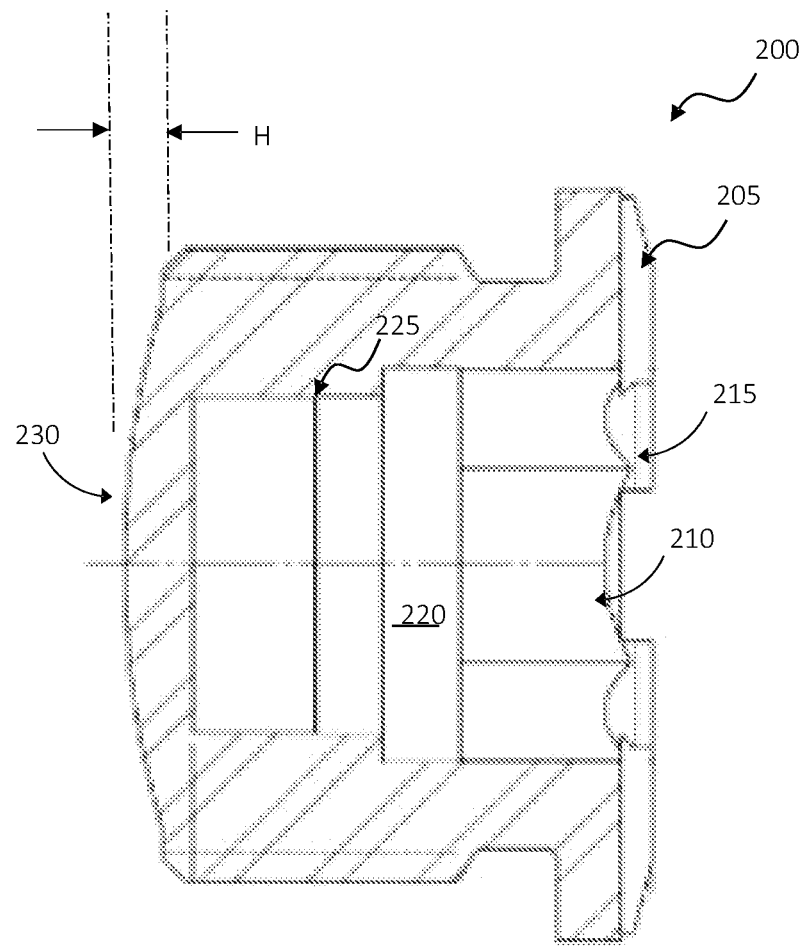
FIG. 2 is a more detailed view of one example of a non-flat shape plug of a sensor assembly for cement slurry sensing, according to one or more embodiments disclosed herein.

FIG. 2 depicts another embodiment of a sensing assembly 200 for cement slurry sensing. In this embodiment, the sensor assembly 200 may include a housing 205 adapted to be integrated into a casing to be positioned in a wellbore formed in a subsurface formation. The housing 205 may include an opening 210 for installing the housing 205 onto the casing, and may also include wire management channels 215, which in some embodiments may be used for routing wires from within the housing 205 to controller of the sensing assembly. Located within the housing 205 is a magnet 220. Adjacent the magnet 220 is a magnetic sensor 225 to detect variations in the magnetic field produced by the magnet 220, such as changes in a permeability of the cement slurry. In some embodiments, detecting variations in the magnetic field includes measuring a change in the magnetic field measurement resulting from a force between the magnet and magnetic particles flowing with a cement slurry inside the casing from a reverse cementing. The magnetic sensor 225, in some embodiments, includes a printed circuit board (PCB) coupled with a magnet.

Adjacent the magnetic sensor 225 is a sensor plug 230 having a side with a non-flat shape that is to be in contact with the cement slurry flowing in the casing of the wellbore. In some embodiments, the non-flat shape may comprise a dome shape, and in other embodiments, the non-flat shape may comprise a cone shape. In some embodiments, an outer surface of the plug 230 may have a non-uniform surface, such as a patterned surface finish or a machined or dimpled pattern.

The non-flat shape of plug 230 increases the distance between the magnet 220 and the slurry fluids passing by wellbore internal to the casing, which reduces the magnetic force on the particles inside the fluid. In addition, having a non-flat surface such as, e.g., a dome, bends the streamline in the flow field and therefore increases flow-induced force on the particles which helps to carry the particles away. The non-flat shape may have a height H, wherein a magnetic field strength of the magnet 220 is inversely proportional to an extent that the side of the sensor plug beyond an internal wall of the casing. Accordingly, the larger the value of the height H, the lesser the magnetic field strength of the magnet 220. In one example, the plug 230 comprises a dome shape and a height H of about 1.2 mm. In this example, the strength of the magnetic field was reduced by about 30%. The height H may be higher or lower than this provided example, according to the desired application within the wellbore.

In some embodiments, a processor may be communicatively coupled to the magnetic sensor 225 and be configured to detect changes in the magnetic permeability of the cement slurry by determining whether the change in the magnetic measurement exceeds a threshold. In some embodiments, the magnetic measurement may comprise one of magnetic flux, magnetic field, and a magnetic force When the magnetic measurement exceeds the threshold, the processor determines that the cement slurry is flowing back up the wellbore internal to the casing at or beyond a location in the wellbore. Once the cement slurry is flowing back up the wellbore internal to the casing, the processor may transmit a signal to an actuator to stop flow of the cement slurry down an annulus between the casing and the subsurface formation. In some embodiments, the processor may be positioned within the housing 205, and in other embodiments, may be positioned at the surface.

Figure 3:
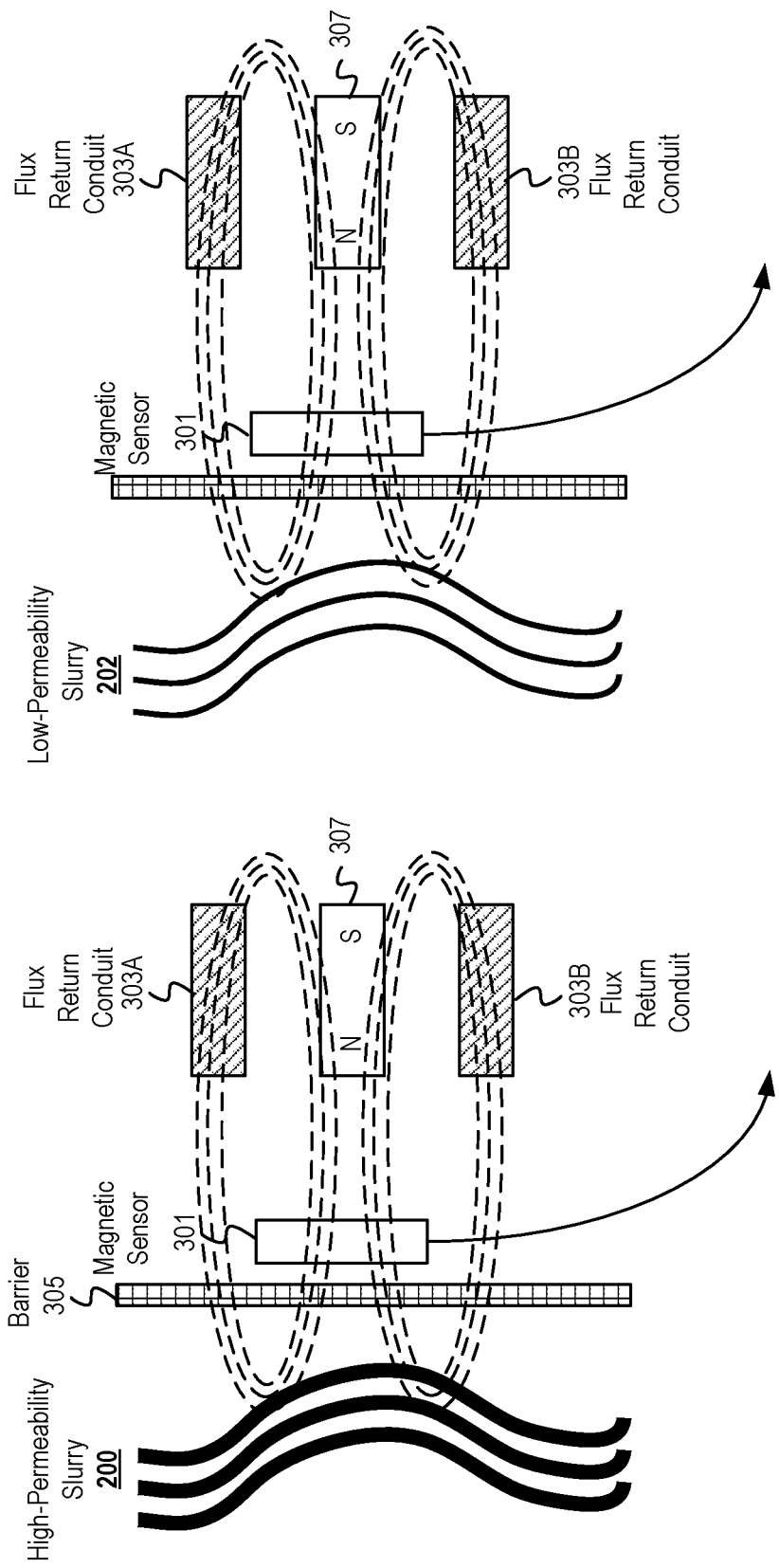
FIG. 3 depicts one embodiment example of a magnetic field sensor for detecting slurries with varying concentrations of high magnetic permeability materials with a permanent magnet, according to one or more embodiments disclosed herein.

FIG. 3 depicts an example magnetic field sensor 301 for detecting slurries with varying concentrations of high magnetic permeability materials with a permanent magnet, according to some embodiments. A magnetic sensor 301 detects a high-permeability slurry 300 and a low-permeability slurry 302 via a magnetic field generated by a permanent magnet 307 that flows through a barrier 305 and is guided by flux return conduits 303A and 303B. The high-permeability slurry 300 comprises a cementing fluid that has been modified by adding a high magnetic permeability material such as an iron powder to distinguish it from the low-permeability slurry 302. The low-permeability slurry 302 can be a distinct cementing fluid from the high-permeability slurry 300 or can be an ambient fluid downhole (e.g., a completion brine or a drill mud). Typically, downhole fluids such as the low-permeability slurry 302 have a relative magnetic permeability of approximately 1, whereas the high-permeability slurry 300 has a higher relative magnetic permeability 112 (e.g., 2 or greater) due to the addition of a ferromagnetic material. More than two cementing fluids corresponding to more than two magnetic permeability values are possible. The cementing fluids can be a cement, a spacer, a brine, a gel, a mud, or other fluids used in the cementing process.

The barrier 305 is made of a non-ferromagnetic material (e.g., austenitic steel, titanium, polymers, composites, aluminum, any alloys thereof such as INCONEL® alloy, etc.) so that it doesn't interfere with the magnetic field generated by the permanent magnet 307. The flux return conduits 303A and 303B are made of a ferromagnetic material and guide the magnetic field generated by the permanent magnet 307 in the direction of the magnetic sensor 301. When the slurry has a high magnetic permeability, such as the high-permeability slurry 300, an increased amount of the magnetic field will flow through the high-permeability slurry 300 and to the magnetic sensor 301, which will have a higher reading. Prior to deployment, the magnetic sensor 301 may be configured to detect ranges of magnetic strength (i.e. determine that measurement satisfy a detection criterion) for both the high-permeability slurry 300 and the low-permeability slurry 302 for the particular configuration of the barrier 305, the permanent magnet 307, and the flux return conduits 303A and 303B relative to the slurry at operational conditions downhole. Alternatively, the magnetic sensor 301 may be configured to detect a change in flux of the measured magnetic field sufficiently large to indicate the presence or absence of a cementing fluid. The magnetic sensor 301 is communicatively coupled to a computing device (not shown) that sends a signal to an actuating mechanism (not shown) that enables a valve to close that prevents flow or restricts flow of the slurry in response to the detection of a cementing fluid. The high-permeability slurry 300 and low-permeability slurry 302 can be inside an oilfield tubular or outside an oilfield tubular facing a formation wall, sufficiently close to a flow port to detect cementing fluid and send a signal to the actuating mechanism to stop fluid flow before or shortly after cementing fluid starts to run up the inside of the oilfield tubular.

Figure 4:
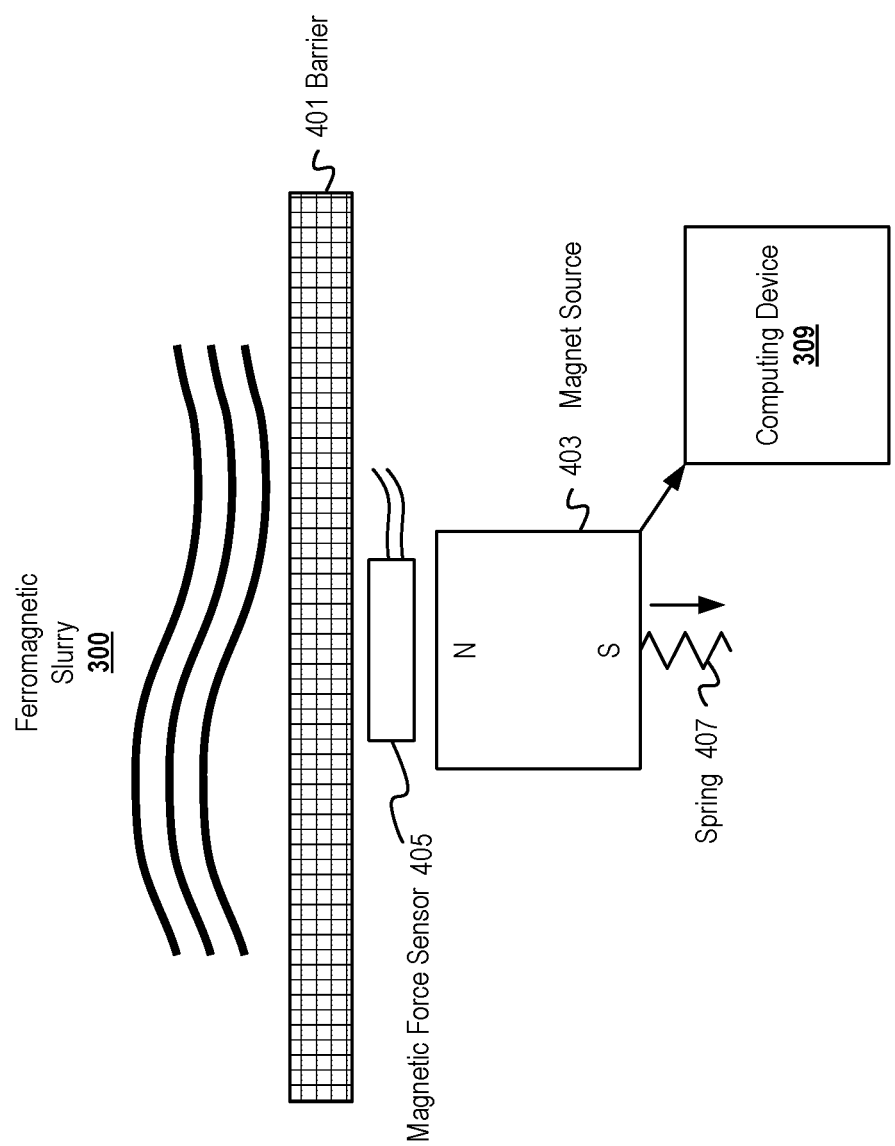
FIG. 4 depicts one example of a permanent magnet with a tension measuring device to measure magnetic permeability of a slurry, according to one or more embodiments disclosed herein.

FIG. 4 depicts an example permanent magnet with a tension measuring device to measure magnetic permeability of a slurry, according to some embodiments. In FIG. 4, a magnet source 403 (e.g., a permanent magnet or an electromagnet) generates a magnetic field that flows through a barrier 401 to a slurry 400 and returns through the barrier 401 to the magnet source 403. When the slurry 400 has a high magnetic permeability, the magnet source 403 experiences an attractive force towards the slurry 400 that is measured by a magnetic force sensor 405. In some embodiments, magnetic force sensor 405 may be positioned between barrier 401 and magnet source 403 as shown. In other embodiments, magnetic force sensor 405 may be positioned in other locations such as affixed to barrier 401 or affixed to magnet source 403. A spring 407 counteracts the attractive force acting on the magnet source 403 due to the increased magnetic field passing through the higher permeability fluid. The spring 407 keeps the magnet source 403 in place as indicated by the downwards arrow in FIG. 4. The magnetic force sensor 405 is communicatively coupled to a computing device 409 that receives tension measurements from the magnetic force sensor 405.

Although depicted as a spring 407, the magnetic source 403 may be affixed to a shield or housing, affixed to the barrier 401, or affixed to any other stationary component, or the spring 407 may be integrated into any other component that adds an opposing (downward) force to the magnet source 403. In some embodiments the spring 407 is replaced with another magnet, or with the stiffness of the magnetic force sensor 405. A compression measuring device could be used as a variation on the tension measurement device. Instead of the single magnet source 403, two magnets may be implemented with the magnetic force sensor 405 between them. Alternatively, a piece of iron or other ferromagnetic material may be placed under the magnetic force sensor 405 and the magnetic source 403 may be situated on top towards the ferromagnetic slurry 400. These embodiments allow the magnetic source 403 to be situated closer to the ferromagnetic slurry 400, resulting in a higher sensitivity to force of the magnetic flux through the ferromagnetic slurry 400.

The magnetic force sensor 405 may be any device that can measure the strength of the attractive force on the magnetic source 403. For example, the tension measuring device can comprise four strain gauges in a Wheatstone bridge configuration. The barrier 401 may be made of a non-ferromagnetic material, as described variously above. The computing device 409 is configured to detect the magnetic permeability of the ferromagnetic slurry 400 based on tension measurements received from the tension measuring device. A higher tension measurement means the magnetic source 403 experiences a stronger attractive force to the ferromagnetic slurry 400, because a higher magnetic force is exerted upon the magnetic source 403 indicating a higher magnetic permeability of the ferromagnetic slurry 400. The computing device 409 is calibrated to detect cementing fluids corresponding to certain ranges of force measurements (i.e., that the tension measurements satisfy a detection criterion) at operational conditions downhole or corresponding to an increase or decrease in the force measurements where the change is above or below thresholds. When a cementing fluid is detecting corresponding to the end of reverse cementing operations, the computing device 409 sends a signal to an actuating mechanism (not pictured) to stop the fluid flow.

Example Operations

Figure 5:
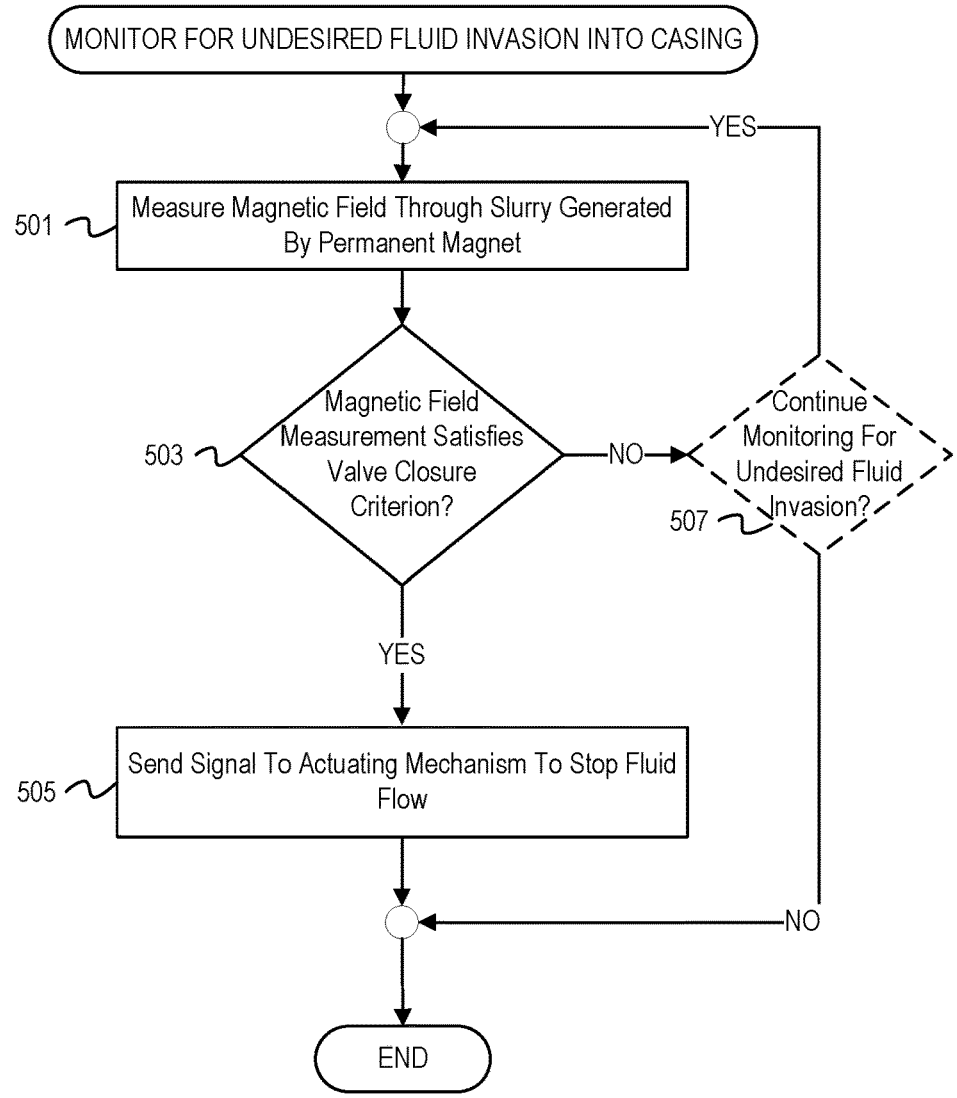
FIG. 5 is a flowchart of one embodiment of a method for detecting cement slurry within the casing during a reverse cementing using a non-flat shape plug, according to one or more embodiments disclosed herein.

FIG. 5 is a flowchart of one embodiment of a method for detecting cement slurry within the casing during a reverse cementing using a non-flat shape plug, according to some embodiments. Embodiments of the method may use one or more embodiments of the magnetic sensing apparatus disclosed herein, which includes a magnet source and a magnetic sensor. In the context of reverse cementing operations, the undesired fluid invasion is by a cementing mixture within a slurry. In the context of gravel packing, the undesired fluid invasion is a gravel-laden slurry. In the context of wellbore cleanup, the undesired fluid invasion is a mud. The operations in FIG. 5 are described with reference to a magnetic field sensor and a computer. These names are for reading convenience and the operations in FIG. 5 may be performed by any component with the functionality described below.

At block 501, the magnetic sensor measures a magnetic field(s) through a window into the downhole oilfield tubular. Note that one or more magnetic field sensors could be used. In one application, a plurality of magnetic field sensors is used in order to determine the flow direction. The magnetic field is generated by a permanent magnet or by an electromagnetic. The magnetic field sensor measures the magnetic field that flows from the magnetic source, through the window, and back to the magnetic field sensor. The strength of the measured magnetic field is correlated with the magnetic permeability of the nearby fluid—a fluid with a higher magnetic permeability increases the strength of the magnetic field measured by the magnetic field sensor. The magnetic field sensor may continuously measure magnetic fields or may take measurements according to a schedule (e.g., every minute). The sensing apparatus may begin monitoring for undesired fluid invasion in response to a control signal, a change in temperature, an acoustic signal, or equivalent. For instance, the magnetic sensor or the computing device may receive a signal from the surface to begin measurements at the beginning of reverse cementing operations to preserve battery power. In another instance, the magnetic sensor or the computing device could note a change in the ambient temperature or note a change in the ambient acoustic noise that indicates a need to start measurements, such as from the circulation of a cementing fluid that is lower than the formation temperature.

At block 503, a computing device communicatively coupled to the magnetic sensor determines whether the magnetic measurement satisfies a criterion for changing the restriction of a valve. As examples, a valve closure criterion can indicate a specified value(s) or a specified range(s) of magnetic field strength. The magnetic sensor transmits measurements of the magnetic strength to the computing device. The computing device receives the measurements and determines whether the target cementing fluid (e.g., a spacer fluid) is present proximate the magnetic sensor. This determination can be based on magnetic field strength being within a certain range of magnetic field strengths known to correspond to a cementing fluid for operational conditions downhole. Alternatively, the determination may be based on a change in magnetic flux above a threshold magnitude. Alternatively, the determination may be based on a pattern of an increase in the magnetic flux followed by a decrease in the magnetic flux during a specified time interval. The computing device may be calibrated to detect multiple types of cementing fluids corresponding to multiple ranges of magnetic flux or based on changes of measured magnetic flux. For instance, the computing device can detect a first cementing fluid and, after an increase of measured magnetic flux above a threshold, can detect a second cementing fluid. Alternatively, after detecting a first cementing fluid the computing device may detect a second cementing fluid based on a decrease of measured magnetic flux above a first threshold and below a second threshold. If the magnetic field measurement satisfies the valve closure criterion, operations continue to block 505. Otherwise, operations continue to block 507.

At block 505, the computing device sends a signal to an actuating mechanism to restrict the fluid flow downhole. The actuating mechanism is located proximate a radial flow port that allows fluid to flow from outside an oilfield tubular to inside the oilfield tubular during reverse cementing operations. The computing device is communicatively coupled to the actuating mechanism and, preferably, in close proximity to the actuating mechanism to minimize delay in the signal and to reduce the chance of communication malfunction. In one embodiment, the actuating mechanism may be as close as 1 inch away from the radial flow port or as far away as 100 feet from the flow port.

At block 507, the computing device determines whether the sensing apparatus should continue to monitor for changes in the magnetic permeability of the fluid. The block 507 is depicted with a dashed line since this determination may be implicit or may be based on an interrupting event (e.g., a message or signal to terminate the monitoring). In some embodiments, determination of whether to continue monitoring may be based on a timing mechanism or a predefined schedule. In some embodiments, there may be a plurality of radial flow ports and plurality of actuating mechanisms.

The flowcharts are provided to aid in understanding the illustrations and are not to be used to limit scope of the claims. The flowcharts depict example operations that may vary within the scope of the claims. Additional operations may be performed; fewer operations may be performed; the operations may be performed in parallel; and the operations may be performed in a different order. For example, the operations depicted in blocks 501 and 503 can be performed in parallel or concurrently. It will be understood that each block of the flowchart illustrations and/or block diagrams, and combinations of blocks in the flowchart illustrations and/or block diagrams, may be implemented by program code. The program code may be provided to a processor of a general-purpose computer, special purpose computer, or other programmable machine or apparatus.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations may be organized differently in accordance with any one of platform (operating system and/or hardware), application ecosystem, interfaces, programmer preferences, programming language, administrator preferences, etc.

Any combination of one or more machine-readable medium(s) may be utilized. The machine-readable medium may be a machine-readable signal medium or a machine-readable storage medium. A machine-readable storage medium may be, for example, but not limited to, a system, apparatus, or device that employs any one of or combination of electronic, magnetic, optical, electromagnetic, infrared, or semiconductor technology to store program code. More specific examples (a non-exhaustive list) of the machine-readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine-readable storage medium may be any tangible medium that can contain or store a program for use by or in connection with an instruction execution system, apparatus, or device. A machine-readable storage medium is not a machine-readable signal medium.

A machine-readable signal medium may include a propagated data signal with machine-readable program code embodied therein, for example, in baseband or as part of a carrier wave. Such a propagated signal may take any of a variety of forms, including, but not limited to, electromagnetic, optical, or any suitable combination thereof. A machine-readable signal medium may be any machine-readable medium that is not a machine-readable storage medium and that can communicate, propagate, or transport a program for use by or in connection with an instruction execution system, apparatus, or device.

Program code embodied on a machine-readable medium may be transmitted using any appropriate medium, including but not limited to wireless, wireline, optical fiber cable, RF, etc., or any suitable combination of the foregoing.

Computer program code for carrying out operations for aspects of the disclosure may be written in any combination of one or more programming languages, including an object oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code may execute entirely on a stand-alone machine, may execute in a distributed manner across multiple machines, and may execute on one machine while providing results and or accepting input on another machine.

The program code/instructions may also be stored in a machine-readable medium that can direct a machine to function in a particular manner, such that the instructions stored in the machine-readable medium produce an article of manufacture including instructions which implement the function/act specified in the flowchart and/or block diagram block or blocks.

Example Computer

Figure 6:
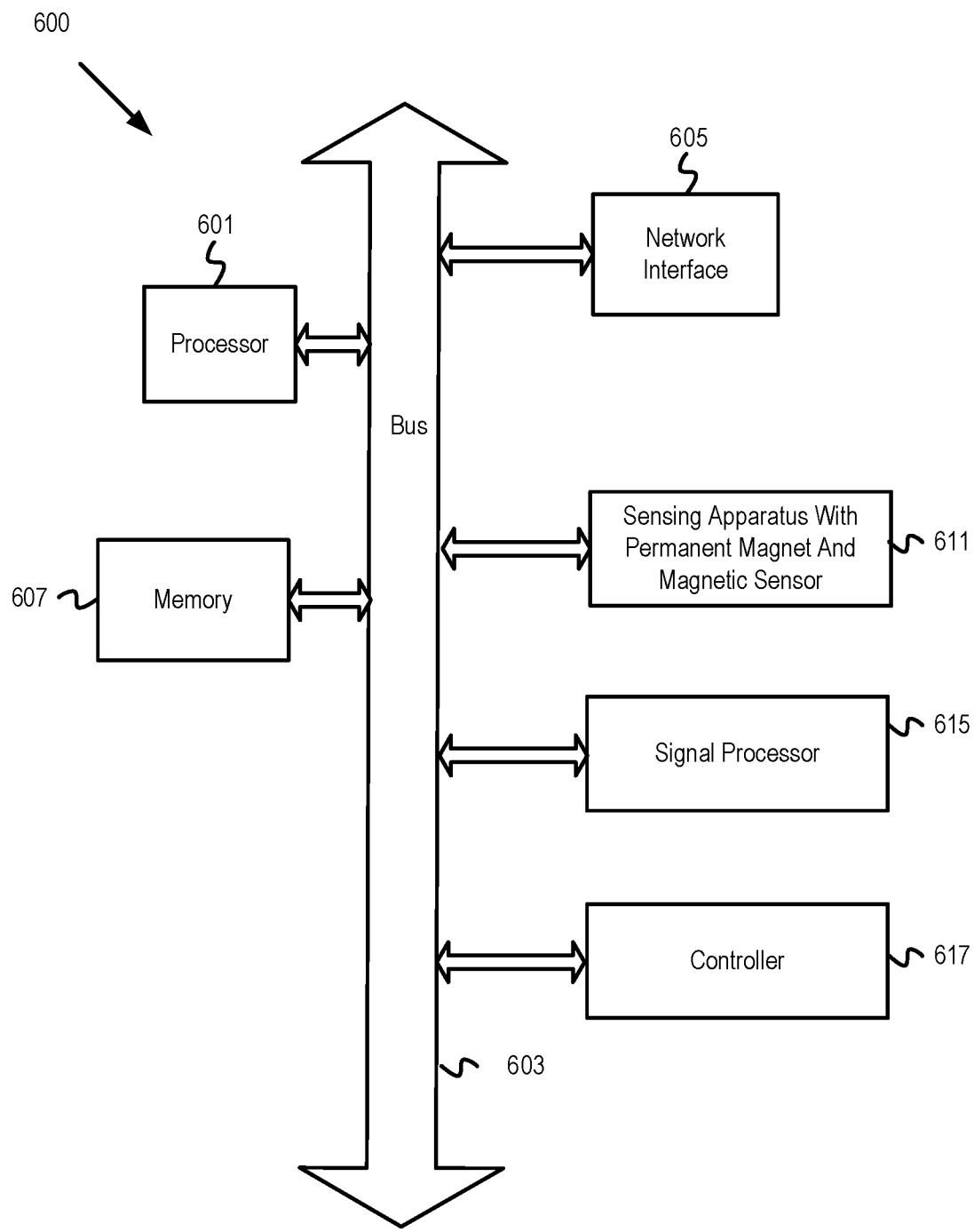
FIG. 6 depicts an example of a computer with a sensing apparatus comprising a permanent magnet and a magnetic field sensor, according to one or more embodiments disclosed herein.

FIG. 6 depicts an example computer with a sensing apparatus comprising a permanent magnet and a magnetic field sensor, according to some embodiments. A computer 600 includes a processor 601 (possibly including multiple processors, multiple cores, multiple nodes, and/or implementing multi-threading, etc.). The computer 600 includes a memory 607. The memory 607 may be system memory or any one or more of the above already described possible realizations of machine-readable media. The computer 600 also includes a bus 603 and a network interface 605. The computer 600 communicates via transmissions to and/or from remote devices via the network interface 605 in accordance with a network protocol corresponding to the type of network interface, whether wired or wireless and depending upon the carrying medium. In addition, a communication or transmission can involve other layers of a communication protocol and or communication protocol suites (e.g., transmission control protocol, Internet Protocol, user datagram protocol, virtual private network protocols, etc.). The system also includes a sensing apparatus with a permanent magnet and magnetic sensor (the sensing apparatus) 611. The sensing apparatus 611 detects the presence of ferromagnetic material in a slurry based on the magnetic field emitted by the permanent magnet and magnetic flux readings by the magnetic field sensor (as described herein).

The computer 600 also includes a signal processor 615 and a controller 617. The signal processor 615 and the controller 617 can perform one or more of the operations described herein. For example, the signal processor 615 can perform process the signals from the magnetic sensor (as described herein). The controller 617 can perform various control operations to a wellbore operation (such as transmitting a signal to stop the flow of cement slurry (as described herein).

Any one of the previously described functionalities may be partially (or entirely) implemented in hardware and/or on the processor 601. For example, the functionality may be implemented with an application specific integrated circuit, in logic implemented in the processor 601, in a co-processor on a peripheral device or card, etc. Further, realizations may include fewer or additional components not illustrated in FIG. 6 (e.g., video cards, audio cards, additional network interfaces, peripheral devices, etc.). The processor 601 and the network interface 605 are coupled to the bus 603. Although illustrated as being coupled to the bus 603, the memory 607 may be coupled to the processor 601.

Example Wireline Application

Figure 7:
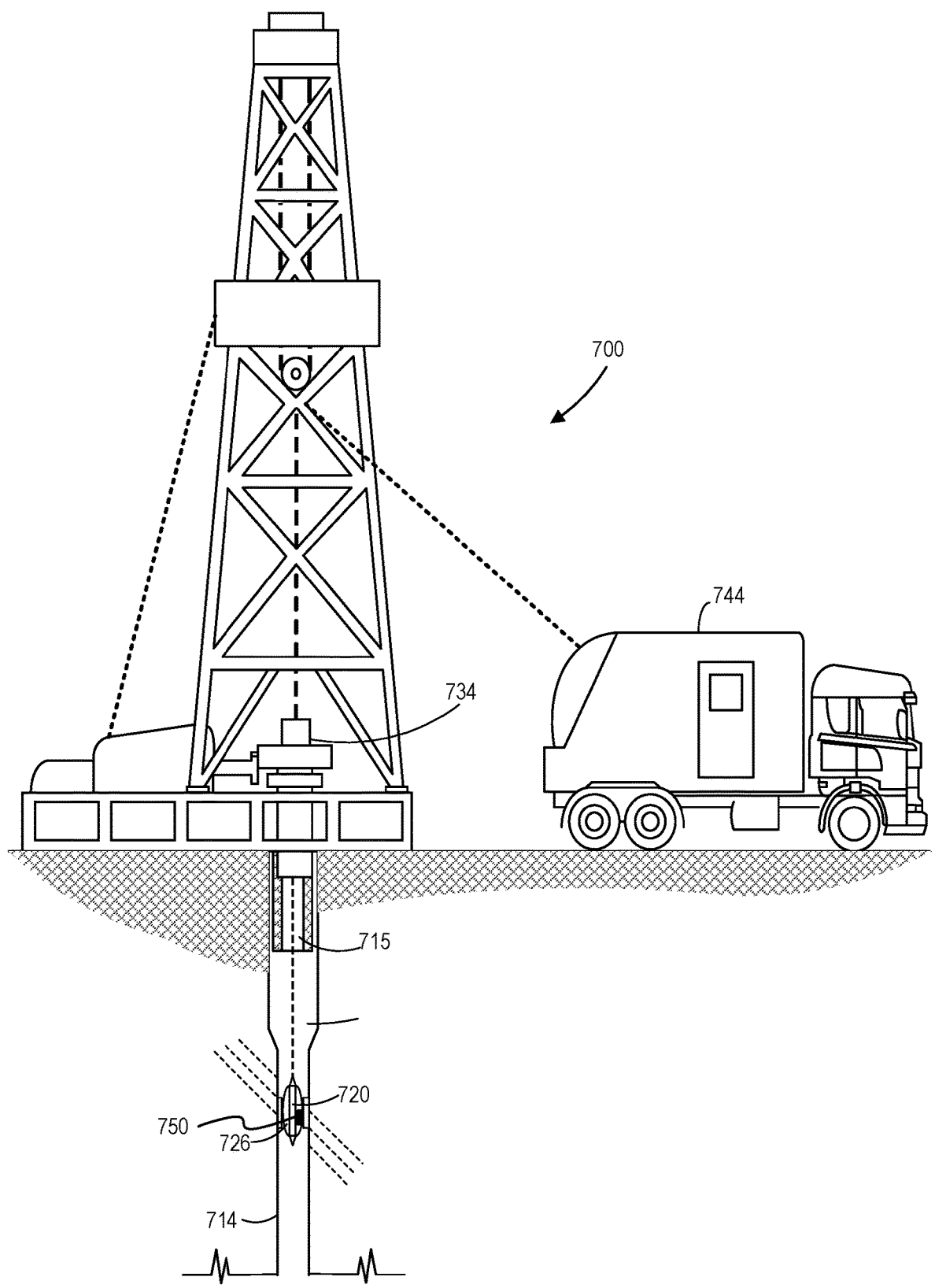
FIG. 7 depicts an example wireline system with a magnetic field sensor having a non-flat shape plug for cement slurry sensing, according to one or more embodiments disclosed herein.

FIG. 7 depicts an example wireline system with a magnetic field sensor having a non-flat shape plug for cement slurry sensing, according to some embodiments. A system 700 can be used in an illustrative logging environment with a drillstring removed, in accordance with some embodiments of the present disclosure.

Subterranean operations may be conducted using a wireline system 720 once the drillstring has been removed, though, at times, some or all of the drillstring may remain in a borehole 714 during logging with the wireline system 720. The wireline system 720 may include one or more logging tools 726 that may be suspended in the borehole 714 by a conveyance 715 (e.g., a cable, slickline, or coiled tubing). The logging tool 726 may be communicatively coupled to the conveyance 715. The conveyance 715 may contain conductors for transporting power to the wireline system 720 and telemetry from the logging tool 726 to a logging facility 744. Alternatively, the conveyance 715 may lack a conductor, as is often the case using slickline or coiled tubing, and the wireline system 720 may contain a control unit 734 that contains memory, one or more batteries, and/or one or more processors for performing operations and storing measurements. A sensing apparatus 750 comprising a permanent magnet and a magnetic field sensor are affixed to the logging tool 726 and can measure magnetic flux of slurry downhole. The logging tool 726 can detect the presence of a ferromagnetic material based on the measured magnetic flux, as described variously above.

In certain embodiments, the control unit 734 can be positioned at the surface, in the borehole (e.g., in the conveyance 715 and/or as part of the logging tool 726) or both (e.g., a portion of the processing may occur downhole and a portion may occur at the surface). The control unit 734 may include a control system or a control algorithm. In certain embodiments, a control system, an algorithm, or a set of machine-readable instructions may cause the control unit 734 to generate and provide an input signal to one or more elements of the logging tool 726, such as the sensors along the logging tool 726. The input signal may cause the sensors to be active or to output signals indicative of sensed properties. The logging facility 744 (shown in FIG. 7 as a truck, although it may be any other structure) may collect measurements from the logging tool 726, and may include computing facilities for controlling, processing, or storing the measurements gathered by the logging tool 726. The computing facilities may be communicatively coupled to the logging tool 726 by way of the conveyance 715 and may operate similarly to the control unit 734. In certain example embodiments, the control unit 734, which may be located in logging tool 726, may perform one or more functions of the computing facility.

The logging tool 726 includes a mandrel and a number of extendible arms coupled to the mandrel. One or more pads are coupled to each of the extendible arms. Each of the pads have a surface facing radially outward from the mandrel. Additionally, at least one sensor may be disposed on the surface of each pad. During operation, the extendible arms are extended outwards to a wall of the borehole to extend the surface of the pads outward against the wall of the borehole. The sensors of the pads of each extendible arm can detect image data to create captured images of the formation surrounding the borehole.

While the aspects of the disclosure are described with reference to various implementations and exploitations, it will be understood that these aspects are illustrative and that the scope of the claims is not limited to them. In general, techniques for detecting magnetic permeability of a sample fluid by measuring the magnetic flux of a magnetic field emitted by a permanent magnet as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

Example Embodiments

Example Embodiments disclosed herein include the following aspects and elements:

Aspect A: An apparatus comprising: a sensor assembly adapted to be integrated into a casing to be positioned in a wellbore formed in a subsurface formation, wherein the sensor assembly comprises, a housing; a magnet located within the housing; a magnetic sensor located within the housing to measure a magnetic measurement change resulting from a force between the magnet and magnetic particles flowing with a cement slurry inside the casing from a reverse cementing; and a sensor plug having a side with a non-flat shape that is to be in contact with the cement slurry flowing in the casing of the wellbore; a processor communicatively coupled to the magnetic sensor and configured to, determine whether the magnetic measurement change exceeds a magnetic threshold; and determine that the cement slurry is flowing back up the wellbore internal to the casing at or beyond a location in the wellbore, in response to a determination that the magnetic measurement change exceeds the magnetic threshold.

Aspect B: An apparatus comprising a sensor assembly adapted to be integrated into a casing to be positioned in a wellbore formed in a subsurface formation, wherein the sensor assembly comprises, a housing; a magnet located within the housing; a magnetic sensor located within the housing to measure a magnetic measurement resulting from a force between the magnet and magnetic particles flowing with a cement slurry inside the casing from a reverse cementing; a sensor plug having a side with a non-flat shape that is to be in contact with the cement slurry flowing in the casing of the wellbore; and a processor communicatively coupled to the magnetic sensor and configured to, determine whether the magnetic measurement exceeds a magnetic threshold; and transmit a signal to an actuator to stop flow of the cement slurry down an annulus between the casing and the subsurface formation, in response to a determination that the magnetic measure exceeds the magnetic threshold.

Aspect C: A method comprising: receiving a magnetic measurement from a magnetic sensor that is within a sensor assembly integrated into a casing positioned in a wellbore formed in a subsurface formation, wherein the magnetic measurement is a result from a force between a magnet in the sensor assembly and magnetic particles flowing with cement slurry inside the casing from a reverse cementing, wherein the sensor assembly includes a sensor plug having a side with a non-flat shape that is to be in contact with the cement slurry flowing in the casing of the wellbore; determining whether the magnetic measurement exceeds a magnetic threshold; and determining that the cement slurry is flowing back up the wellbore internal to the casing at or beyond a location in the wellbore, in response to a determination that the magnetic measurement exceeds the magnetic threshold.

Aspects A, B, and C may have one or more of the following additional elements in combination:

Element 1: wherein the non-flat shape comprises a dome shape;

Element 2: wherein the non-flat shape comprises a cone shape;

Element 3: wherein the non-flat shape comprises a non-uniform surface, wherein the non-uniform surface is one of a surface finish on an outer surface of the plug and a machined pattern on the outer surface;

Element 4: wherein the magnetic sensor includes a sensor and a printed circuit board (PCB) coupled together;

Element 5: wherein the processor is configured to transmit a signal to an actuator to stop flow of the cement slurry down an annulus between the casing and the subsurface formation, in response to a determination that the cement slurry is flowing back up the wellbore internal to the casing at or beyond the location in the wellbore;

Element 6: wherein the magnetic sensor comprises one of a giant magnetoresistance sensor, a force sensor, and a Hall sensor;

Element 7: wherein the magnetic measurement comprises one of magnetic flux, magnetic field, and magnetic force;

Element 8: wherein a magnetic field strength of the magnet is inversely proportional to an extent that the side of the sensor plug beyond an internal wall of the casing; and Element 9: further comprising transmitting a signal to an actuator to stop flow of the cement slurry down an annulus between the casing and the subsurface formation.

Those skilled in the art to which this application relates will appreciate that other and further additions, deletions, substitutions and modifications may be made to the described embodiments.

What is claimed is:

1. An apparatus comprising:
    a sensor assembly adapted to be integrated into a casing to be positioned in a wellbore formed in a subsurface formation, wherein the sensor assembly comprises,
    a housing;
    a magnet located within the housing;
    a magnetic sensor located within the housing to measure a magnetic measurement change resulting from a force between the magnet and magnetic particles flowing with a cement slurry inside the casing from a reverse cementing; and
    a sensor plug having a side with a non-flat shape that is to be in contact with the cement slurry flowing in the casing of the wellbore;
    a processor communicatively coupled to the magnetic sensor and configured to,
        determine whether the magnetic measurement change exceeds a magnetic threshold; and
        determine that the cement slurry is flowing back up the wellbore internal to the casing at or beyond a location in the wellbore, in response to a determination that the magnetic measurement change exceeds the magnetic threshold.

2. The apparatus of claim 1, wherein the non-flat shape comprises a dome shape.

3. The apparatus of claim 1, wherein the non-flat shape comprises a cone shape.

4. The apparatus of claim 1, wherein the non-flat shape comprises a non-uniform surface, wherein the non-uniform surface is one of a surface finish on an outer surface of the sensor plug and a machined pattern on the outer surface.

5. The apparatus of claim 1, wherein the magnetic sensor includes a sensor and a printed circuit board (PCB) coupled together.

6. The apparatus of claim 1, wherein the processor is configured to:
    transmit a signal to an actuator to stop flow of the cement slurry down an annulus between the casing and the subsurface formation, in response to a determination that the cement slurry is flowing back up the wellbore internal to the casing at or beyond the location in the wellbore.

7. The apparatus of claim 1, wherein the magnetic sensor comprises one of a giant magnetoresistance sensor, a force sensor, and a Hall sensor.

8. The apparatus of claim 1, wherein the magnetic measurement comprises one of magnetic flux, magnetic field, and magnetic force.

9. The apparatus of claim 1, wherein a magnetic field strength of the magnet is inversely proportional to an extent that the side of the sensor plug beyond an internal wall of the casing.

10. An apparatus comprising:
    a sensor assembly adapted to be integrated into a casing to be positioned in a wellbore formed in a subsurface formation, wherein the sensor assembly comprises,
    a housing;
    a magnet located within the housing;
    a magnetic sensor located within the housing to measure a magnetic measurement resulting from a force between the magnet and magnetic particles flowing with a cement slurry inside the casing from a reverse cementing;
    a sensor plug having a side with a non-flat shape that is to be in contact with the cement slurry flowing in the casing of the wellbore; and
    a processor communicatively coupled to the magnetic sensor and configured to,
        determine whether the magnetic measurement exceeds a magnetic threshold; and transmit a signal to an actuator to stop flow of the cement slurry down an annulus between the casing and the subsurface formation, in response to a determination that the magnetic measure exceeds the magnetic threshold.

11. The apparatus of claim 10, wherein the non-flat shape comprises at least one of a dome shape, a cone shape, and a shape that includes a non-uniform surface.

12. The apparatus of claim 10, wherein the magnetic sensor comprises one of a giant magnetoresistance sensor, a force sensor, and a Hall sensor.

13. The apparatus of claim 10, wherein the magnetic measurement comprises one of magnetic flux, magnetic field, and magnetic force.

14. The apparatus of claim 10, wherein a magnetic field strength of the magnet is inversely proportional to an extent that the side of the sensor plug beyond an internal wall of the casing.

15. A method comprising:
receiving a magnetic measurement from a magnetic sensor that is within a sensor assembly integrated into a casing positioned in a wellbore formed in a subsurface formation, wherein the magnetic measurement is a result from a force between a magnet in the sensor assembly and magnetic particles flowing with cement slurry inside the casing from a reverse cementing, wherein the sensor assembly includes a sensor plug having a side with a non-flat shape that is to be in contact with the cement slurry flowing in the casing of the wellbore;
determining whether the magnetic measurement exceeds a magnetic threshold; and
determining that the cement slurry is flowing back up the wellbore internal to the casing at or beyond a location in the wellbore, in response to a determination that the magnetic measurement exceeds the magnetic threshold.

16. The method of claim 15, further comprising transmitting a signal to an actuator to stop flow of the cement slurry down an annulus between the casing and the subsurface formation.

17. The method of claim 15, wherein the non-flat shape comprises at least one of a dome shape, a cone shape, and a shape that includes a non-uniform surface.

18. The method of claim 15, wherein a magnetic field strength of the magnet is inversely proportional to an extent that the side of the sensor plug beyond an internal wall of the casing.

19. The apparatus of claim 1, wherein the plug comprises at least a portion of the housing.

20. The apparatus of claim 1, wherein the housing includes wire management channels for routing wires from within the housing.

* * * * *